(12) United States Patent
Matsueda

(10) Patent No.: US 10,685,600 B2
(45) Date of Patent: Jun. 16, 2020

(54) OLED DISPLAY DEVICE, CIRCUIT THEREIN, AND METHOD OF MANUFACTURING OLED DISPLAY DEVICE

(71) Applicant: TIANMA JAPAN, LTD., Kawasaki, Kanagawa (JP)

(72) Inventor: Yojiro Matsueda, Kawasaki (JP)

(73) Assignee: TIANMA MICROELECTRONICS CO., LTD., Longhua District, Chenzhen (CN)

( * ) Notice: Subject to any disclaimer, the term of this patent is extended or adjusted under 35 U.S.C. 154(b) by 51 days.

(21) Appl. No.: 16/019,876

(22) Filed: Jun. 27, 2018

(65) Prior Publication Data

US 2019/0027092 A1 Jan. 24, 2019

(30) Foreign Application Priority Data

Jul. 21, 2017 (JP) ................................. 2017-141560

(51) Int. Cl.
*G09G 3/3233* (2016.01)
*H01L 51/52* (2006.01)
(Continued)

(52) U.S. Cl.
CPC ......... *G09G 3/3233* (2013.01); *H01L 27/124* (2013.01); *H01L 27/1255* (2013.01); *H01L 27/3211* (2013.01); *H01L 27/3246* (2013.01); *H01L 27/3262* (2013.01); *H01L 27/3265* (2013.01); *H01L 27/3276* (2013.01); *H01L 51/5218* (2013.01); *H01L 51/5234* (2013.01); *H01L 51/5237* (2013.01);
(Continued)

(58) Field of Classification Search
CPC ... G09G 2300/0426; G09G 2300/0819; G09G 2300/0842; G09G 2300/0861; G09G 2310/0251; G09G 3/3233; G09G 3/3258; G09G 3/3225; H01L 27/124; H01L 27/3211; H01L 27/3246; H01L 27/3262; H01L 27/3265; H01L 27/3276; H01L 27/3279; H01L 51/5218; H01L 51/5234; H01L 51/5237; H01L 27/1255; H01L 29/78633; H01L 29/78606; H01L 27/3218; H01L 27/3248
See application file for complete search history.

(56) References Cited

U.S. PATENT DOCUMENTS

2012/0249510 A1\* 10/2012 Jankovic .............. G09G 3/3233
345/211
2014/0291636 A1\* 10/2014 Kim .................... H01L 27/3262
257/40

(Continued)

*Primary Examiner* — Richard J Hong
(74) *Attorney, Agent, or Firm* — Sughrue Mion, PLLC

(57) ABSTRACT

A circuit includes a first thin film transistor configured to supply electric current to an organic light-emitting film, and a storage capacitor. The first thin film transistor includes a bottom gate electrode, a channel provided on a layer upper than the bottom gate electrode to overlap with the bottom gate electrode, and a top gate electrode. The storage capacitor includes a storage capacitor electrode made of an impurity semiconductor, the storage capacitor electrode being provided outside an overlap area with the top gate electrode on the same layer as the channel to overlap with the bottom gate electrode with the first gate insulating layer interposed.

15 Claims, 12 Drawing Sheets

(51) Int. Cl.
*H01L 27/32* (2006.01)
*H01L 27/12* (2006.01)

(52) U.S. Cl.
CPC .............. *G09G 2300/0426* (2013.01); *G09G 2300/0819* (2013.01); *G09G 2300/0842* (2013.01); *G09G 2300/0861* (2013.01); *G09G 2310/0251* (2013.01); *H01L 27/3279* (2013.01)

(56) References Cited

U.S. PATENT DOCUMENTS

| | | | |
|---|---|---|---|
| 2015/0102344 A1* | 4/2015 | Song ................... | H01L 27/1255 257/59 |
| 2016/0043159 A1* | 2/2016 | Kim .................... | H01L 27/3262 257/71 |
| 2016/0071463 A1* | 3/2016 | Takahashi ............ | G09G 3/3225 345/76 |
| 2016/0087021 A1* | 3/2016 | Sato .................... | H01L 27/3262 257/43 |
| 2016/0148981 A1* | 5/2016 | Matsueda ........... | H01L 27/3218 257/40 |
| 2016/0260843 A1* | 9/2016 | Choi ................. | H01L 29/78633 |
| 2017/0062545 A1 | 3/2017 | Oh et al. | |
| 2017/0294497 A1* | 10/2017 | Lius .................... | H01L 27/1255 |
| 2017/0337875 A1* | 11/2017 | Jeon ..................... | G09G 3/3258 |
| 2018/0062105 A1* | 3/2018 | Lius .................... | H01L 27/3262 |
| 2018/0114823 A1* | 4/2018 | Lee ................... | H01L 29/78606 |
| 2018/0151114 A1* | 5/2018 | Choi ................... | H01L 27/3248 |

\* cited by examiner

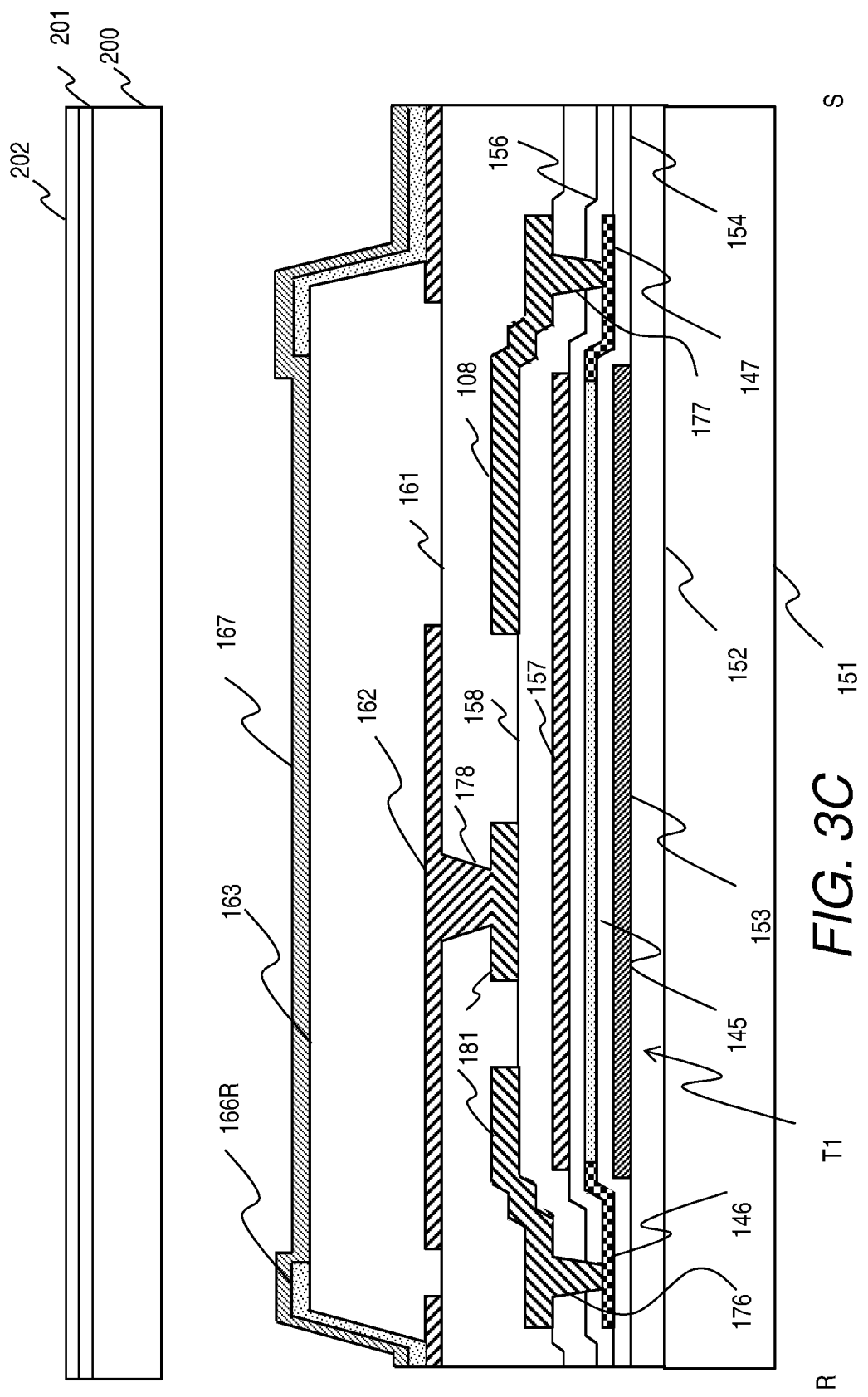

OLED DISPLAY DEVICE, CIRCUIT THEREIN, AND METHOD OF MANUFACTURING OLED DISPLAY DEVICE

CROSS-REFERENCE TO RELATED APPLICATIONS

This Non-provisional application claims priority under 35 U.S.C. § 119(a) on Patent Application No. 2017-141560 filed in Japan on Jul. 21, 2017, the entire content of which is hereby incorporated by reference.

BACKGROUND

This disclosure relates to an OLED display device, a circuit therein, and a method of manufacturing the OLED display device.

The organic light-emitting diode (OLED) element is a current-driven self-light-emitting element and therefore, eliminates the necessity of backlight. In addition to this, the OLED display element has advantages for achievement of low power consumption, wide viewing angle, and high contrast ratio; it is expected to contribute to development of flat panel display devices.

An active-matrix (AM) OLED display device includes selecting transistors for selecting pixels and driving transistors for supplying electric current to the pixels. The transistors in an OLED display device are thin film transistors (TFTs); particularly, low-temperature polysilicon (LTPS) TFTs are commonly used. Furthermore, a typical OLED display device includes a compensation circuit for compensating for the differences and variation in threshold voltage of the driving transistors.

TFTs having existing structures have hysteresis characteristics. Because of the hysteresis characteristics, the drain current flows differently in raising and lowering the gate potential. The hysteresis characteristics of the driving transistors cause a phenomenon called image retention. For example, when an OLED display device is controlled to change the display to a white picture after displaying a black picture for a while, the screen does not become white upon the operation to change but takes several frames to display the white picture.

When no current flows in a driving TFT for a long time, the hysteresis of the driving TFT is initialized. If a Vgs bias to display a white picture determined based on the initialized hysteresis is applied, the current decreases instantly because of the hysteresis, so that the intended brightness for the white picture is not attained.

Meanwhile, in terms of manufacturing an OLED display device, efficient processes are desired. An OLED display device has a multi-layer structure including pixels with organic light-emitting elements and pixel circuits for controlling the intensity of light to be emitted from the pixels. Manufacturing an OLED display device repeats patterning using a mask having a different opening pattern to form the pixel circuits and organic light-emitting elements on a substrate.

SUMMARY

An aspect of the disclosure is a circuit configured to control intensity of light to be emitted from a pixel of an OLED display device, the circuit including: a first thin film transistor configured to supply electric current to an organic light-emitting film; and a storage capacitor configured to maintain gate potential of the first thin film transistor, wherein the first thin film transistor includes: a bottom gate electrode; a channel provided on a layer upper than the bottom gate electrode to overlap with the bottom gate electrode; a first gate insulating layer provided between the channel and the bottom gate electrode; a top gate electrode provided on a layer upper than the channel to overlap with the channel and connected with the bottom gate electrode; and a second gate insulating layer provided between the channel and the top gate electrode, and wherein the storage capacitor includes a storage capacitor electrode made of an impurity semiconductor, the storage capacitor electrode being provided outside an overlap area with the top gate electrode on the same layer as the channel to overlap with the bottom gate electrode with the first gate insulating layer interposed.

It is to be understood that both the foregoing general description and the following detailed description are exemplary and explanatory and are not restrictive of this disclosure.

BRIEF DESCRIPTION OF THE DRAWINGS

FIG. 3C is a cross-sectional diagram cut along the line R-S in FIG. 3A;

EMBODIMENTS

Figure 1:
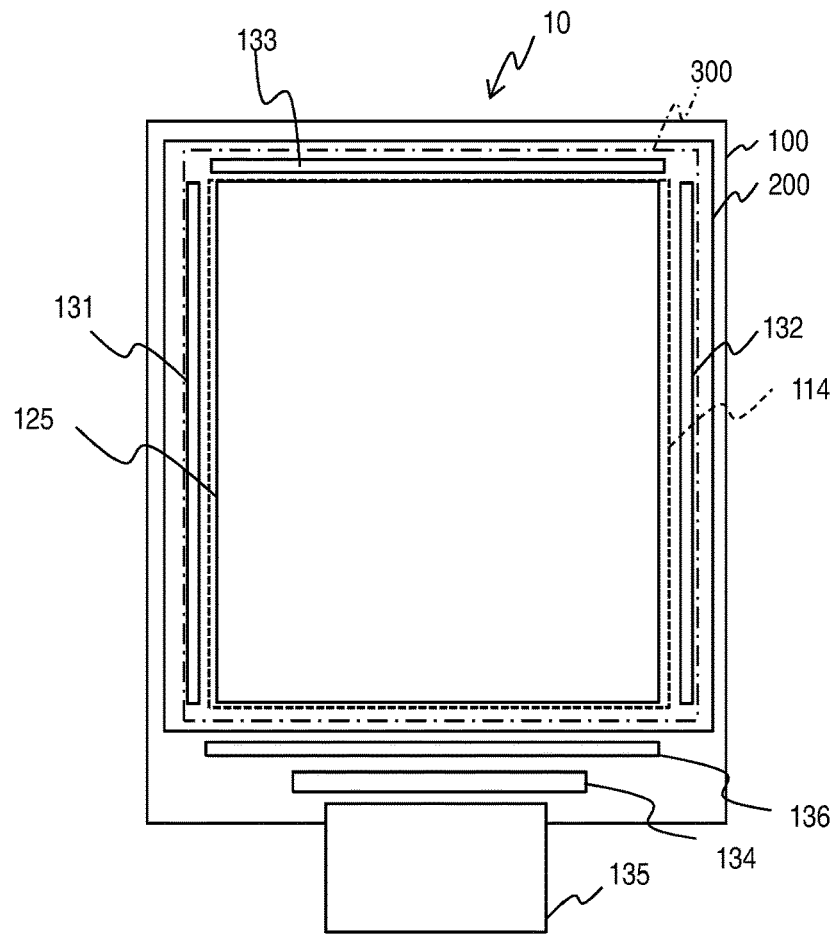
FIG. 1 schematically illustrates a configuration example of an OLED display device in this disclosure.

Hereinafter, embodiments of this disclosure will be described with reference to the accompanying drawings. It should be noted that the embodiments are merely examples to implement this disclosure and are not to limit the technical scope of this disclosure.

The pixel circuit of the organic light-emitting diode (OLED) display device disclosed herein includes a dual-gate driving TFT. The gate of a dual-gate TFT has a dual-gate structure including a top gate electrode and a bottom gate electrode sandwiching a channel.

The research of the inventors revealed that the hysteresis of a TFT to cause image retention can be significantly reduced with a dual-gate TFT. An experimentally fabricated dual-gate TFT showed small hysteresis characteristics, compared to a single-gate TFT.

The dual-gate TFT however includes another gate electrode in addition to the normal TFT structure. Accordingly, manufacturing an OLED display device requires a mask for forming the additional gate electrodes and a patterning step.

The pixel circuit disclosed hereinafter includes a storage capacitor electrode provided on the same layer as the semiconductor area of the driving TFT. The storage capacitor is to maintain the gate potential of the driving TFT. The storage capacitor electrode is made of an impurity-doped semiconductor and formed together with the semiconductor area of the driving TFT. The storage capacitor electrode is formed to overlap with the bottom gate electrode and configures a storage capacitor with the bottom gate electrode.

The semiconductor area of a driving TFT includes a channel and impurity-doped areas (source area and drain area) sandwiching the channel. Each of the impurity-doped areas is doped with impurities and is in contact with a source electrode or a drain electrode. The OLED display device manufacturing method disclosed hereinafter forms impurity-doped areas by doping the semiconductor areas with impurities using the top gate electrodes as a mask (self-aligned process).

A top gate electrode is provided outside the overlap area with the storage capacitor electrode. In other words, the top gate electrode is provided not to overlap with the storage capacitor electrode. Accordingly, doping the semiconductor area of the driving TFT applies impurities to the storage capacitor electrode on the same layer as the semiconductor area. The impurity doping lowers the resistance of the storage capacitor electrode, attaining the required characteristics for the storage capacitor electrode.

As described above, a driving TFT having a dual-gate structure has smaller hysteresis characteristics to effectively reduce the image retention caused by hysteresis. Furthermore, the storage capacitor electrodes to be doped with impurities are formed on the same layer as the semiconductor areas of the driving TFTs not to overlap with top gate electrodes. This structure enables the semiconductor areas and storage capacitor electrodes of driving TFTs to be formed together by self-aligned processes (patterning and doping). As a result, the OLED display device can be manufactured with a smaller number of masks.

Hereinafter, embodiments are specifically described with reference to the drawings. Elements common to the drawings are denoted by the same reference signs. The elements in the drawings may be exaggerated in size or shape for clear understanding of the description.

Overall Configuration

FIG. 1 schematically illustrates a configuration example of an OLED display device 10 in this disclosure. The OLED display device 10 includes a thin film transistor (TFT) substrate 100 on which organic light-emitting elements are formed, an encapsulation substrate 200 for encapsulating the organic light-emitting elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, a driver IC 134, and a demultiplexer 136 are provided. The driver IC 134 is connected to the external devices via flexible printed circuits (FPC) 135.

The scanning driver 131 drives scanning lines on the TFT substrate 100. The emission driver 132 drives emission control lines to control the emission periods of sub-pixels. The driver IC 134 can be mounted with an anisotropic conductive film (ACF).

The driver IC 134 provides power and timing signals (control signals) to the scanning driver 131 and the emission driver 132 and further, provides power and a data signal to the demultiplexer 136.

The demultiplexer 136 outputs output of one pin of the driver IC 134 to n data lines in series (n is an integer more than 1). The demultiplexer 136 changes the output data line for the data signal from the driver IC 134 n times per scanning period to drive as many data lines as n times the number of output pins of the driver IC 134.

Configuration of Pixel Circuit

Figure 2A:
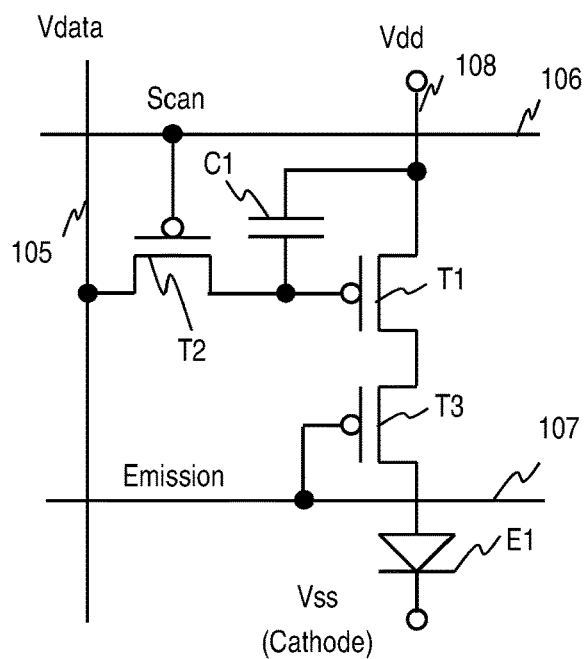
FIG. 2A illustrates a configuration example of a pixel circuit.

A plurality of pixel circuits are formed on the substrate 100 to control the current to be supplied to the anode electrodes of sub-pixels. FIG. 2A illustrates a configuration example of a pixel circuit. Each pixel circuit includes a first transistor T1, a second transistor T2, a third transistor T3, and a storage capacitor C1. The pixel circuit controls light emission of an OLED element E1 of a sub-pixel. The transistors are thin film transistors (TFTs). Hereinafter, the first transistor T1 to the third transistor T3 are abbreviated as transistor T1 to transistor T3.

The transistor T2 is a switch for selecting the sub-pixel. The transistor T2 is a p-channel TFT and its gate terminal is connected with a scanning line 106. The drain terminal is connected with a data line 105. The source terminal is connected with the gate terminal of the transistor T1.

The transistor T1 is a transistor (driving TFT) for driving the OLED element E1. The transistor T1 is a p-channel TFT and its gate terminal is connected with the source terminal of the transistor T2. The source terminal of the transistor T1 is connected with a power line (Vdd) 108. The drain terminal is connected with the source terminal of the transistor T3. The storage capacitor C1 is provided between the gate terminal and the source terminal of the transistor T1.

The transistor T3 is a switch for controlling supply/stop of the driving current to the OLED element E1. The transistor T3 is a p-channel TFT and its gate terminal is connected with an emission control line 107. The source terminal of the transistor T3 is connected with the drain terminal of the transistor T1. The drain terminal is connected with the OLED element E1.

Next, operation of the pixel circuit is described. The scanning driver 131 outputs a selection pulse to the scanning line 106 to tune on the transistor T2. The data voltage supplied from the driver IC 134 through the data line 105 is stored to the storage capacitor C1. The storage capacitor C1 holds the stored voltage during the period of one frame. The conductance of the transistor T1 changes in an analog manner in accordance with the stored voltage, so that the transistor T1 supplies a forward bias current corresponding to a light emission level to the OLED element E1.

The transistor T3 is located on the supply path of the driving current. The emission driver 132 outputs a control signal to the emission control line 107 to turn the transistor T3 on or off. When the transistor T3 is on, the driving current is supplied to the OLED element E1. When the transistor T3 is off, this supply is stopped. The lighting period (duty ratio) in the period of one field can be controlled by turning on and off the transistor T3.

Figure 2B:
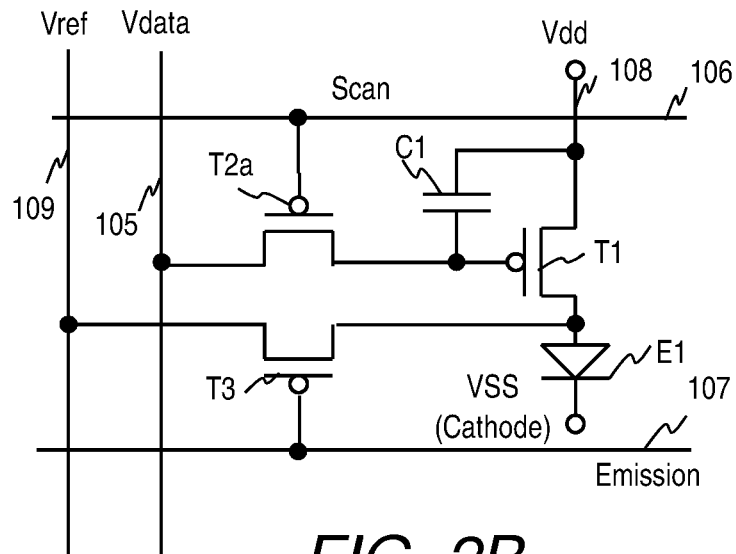
FIG. 2B illustrates another configuration example of a pixel circuit.

FIG. 2B illustrates another configuration example of a pixel circuit. The differences from the pixel circuit in FIG. 2A are the transistor T2a and the transistor T3. The transistor T2a is a switch having the same function as the transistor T2 in FIG. 2A, or a switch for selecting the sub-pixel.

The transistor T3 can be used for various purposes. For example, the transistor T3 can be used to reset the anode electrode of the OLED element E1 once to a sufficiently low voltage that is lower than the black signal level to prevent crosstalk caused by leak current between OLED elements E1.

The transistor T3 can also be used to measure a characteristic of the transistor T1. For example, the voltage-current characteristic of the transistor T1 can be accurately measured by measuring the current flowing from the power line 108 (Vdd) to the reference voltage supply line 109 (Vref) under the bias conditions selected so that the transistor T1 will operate in the saturated region and the switching transistor T3 will operate in the linear region. If the differences in voltage-current characteristic among the transistors T1 for individual sub-pixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 109 when the transistor T1 is off and the transistor T3 is operating in the linear region. In the case where the OLED element E1 is deteriorated because of long-term use, for example, if the deterioration is compensated for by generating a data signal at an external circuit, the display device can have a long life spun.

The circuit configurations in FIGS. 2A and 2B are examples; the pixel circuit may have a different circuit configuration. Although the pixel circuits in FIGS. 2A and 2B use p-channel TFTs, the pixel circuit may employ n-channel TFTs.

Details of Display Region

Figure 2C:
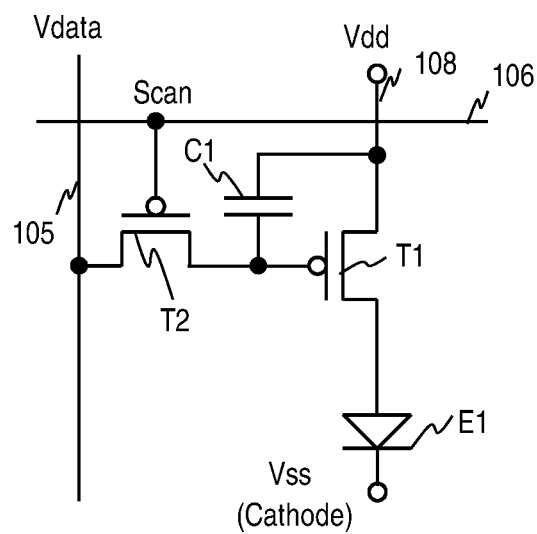
FIG. 2C illustrates still another configuration example of a pixel circuit.

Hereinafter, a pixel layout, a physical structure of a pixel circuit, and a method of manufacturing an OLED display device are described. Particularly, structures of the driving TFT (the first transistor T1) and the storage capacitor C1 and a method of manufacturing those are described in detail. For simplicity of explanation, an example employing sub-pixels having the pixel circuit configuration illustrated in FIG. 2C is described. The pixel circuit in FIG. 2C has a configuration in which the transistor T3 and the emission control line are omitted from the pixel circuit illustrated in FIG. 2A. The element structure and the manufacturing method described hereinafter are applicable to other pixel circuit configurations like those illustrated in FIGS. 2A and 2B.

Figure 3A:
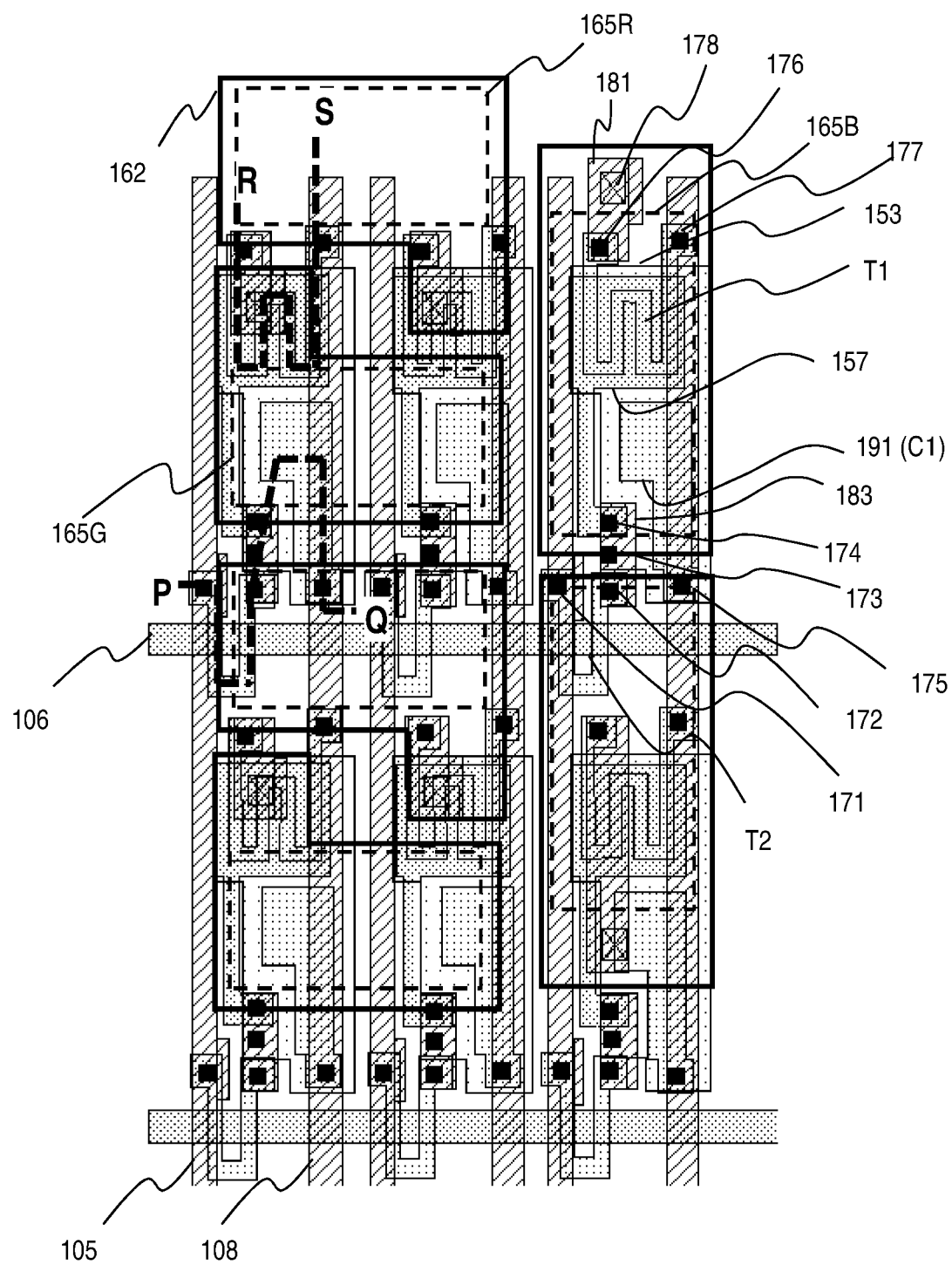
FIG. 3A is a plan diagram for illustrating a configuration of a part of a display region.

FIG. 3A is a plan diagram for illustrating a configuration of a part of the display region 125. The elements in FIG. 3A are drawn transparently to help to see stacked elements. FIG. 3A includes two main pixels. One main pixel consists of three sub-pixels: a red sub-pixel, a green sub-pixel, and a blue sub-pixel. Each sub-pixel (OLED element) is associated with one pixel circuit. The boundary of a pixel is defined depending on the relation with the adjacent sub-pixel sets in the condition where sub-pixel sets are cyclically disposed. Each pixel may have a rectangular shape or a shape other than a rectangle.

The top, bottom, left, and right in the following description corresponds to the top, bottom, left, and right of FIG. 3A. The horizontal direction corresponds to the row direction of the pixels arrayed in a matrix and the vertical direction corresponds to the column direction of the same. The normal direction to the sheet of FIG. 3A corresponds to the stacking direction of the display region 125 (sub-pixels and pixel circuits).

In FIG. 3A, the OLED elements (sub-pixels) and the elements of the pixel circuits are partially denoted by reference signs for simplicity of illustration. The pixel circuits of sub-pixels for different colors have different physical structures in some part but have the same circuit configuration. Accordingly, description of elements with reference signs in one OLED element or pixel circuit is applicable to the other OLED elements or pixel circuits without reference signs.

In the pixel layout example in FIG. 3A, the light emitting region 165R of a red sub-pixel is provided above the light emitting region 165G of a green sub-pixel. The light emitting region 165B of a blue sub-pixel is provided on the right of the light emitting region 165R of the red sub-pixel and the light emitting region 165G of the green sub-pixel. Red light emitting regions 165R and green light emitting regions 165G are provided alternately in the vertical direction into a column.

Blue light emitting regions 165B are provided successively in the vertical direction into a column. In the upper pixel row, the blue light emitting region 165B is closer to the green light emitting region 165G than the red light emitting region 165R. In the lower pixel row, the blue light emitting region 165B is closer to the red light emitting region 165R than the green light emitting region 165G. The pixel layout pattern illustrated in FIG. 3A is repeated in the entire display region 125.

The pixel layout in FIG. 3A is an example and the feature of this disclose is applicable to any other pixel layout, such as an RGB stripe arrangement where red, green, and blue sub-pixel columns are disposed in rotation or a pentile arrangement. For example, two adjacent blue light emitting regions may be borderless and a pair of the borderless light emitting regions may be separate from other pairs.

In each sub-pixel, the light emitting region is provided within the anode electrode 162. The anode electrode 162 is connected with the drain of the driving TFT T1 through a contact 178, an electrode 181, and a contact 176. The contact 178 interconnects the anode electrode 162 and the electrode 181; the contact 176 interconnects the electrode 181 and the drain of the driving TFT T1.

As will be described later, the driving TFT T1 has a dual gate structure. The dual gate structure in this disclosure includes a top gate electrode 157 and a bottom gate electrode 153 sandwiching a semiconductor area in the stacking direction with insulating layers interposed.

The source of the driving TFT T1 is connected with a power line 108 through a contact 177. Power lines 108 are disposed to extend in the vertical direction and to be regularly distant from one another in the horizontal direction. Each pixel column is supplied with current from three power lines 108.

The top gate electrode 157 of the driving TFT T1 is connected with the bottom gate electrode 153 through a contact 174, an electrode 183, and a contact 173. The contact 174 interconnects the top gate electrode 157 and the electrode 183; the contact 173 interconnects the electrode 183 and the bottom gate electrode 153.

The top gate electrode 157 and the bottom gate electrode 153 are further connected with the drain of the switching TFT (second transistor) T2 through the electrode 183 and a contact 172. The contact 172 interconnects the electrode 183 and the drain of the switching TFT T2.

The storage capacitor C1 is configured between a storage capacitor electrode 191 and the bottom gate electrode 153. The storage capacitor electrode 191 is disposed (formed) to overlap with the bottom gate electrode 153 in the stacking direction. The storage capacitor electrode 191 is disposed (formed) outside the overlap area with the top gate electrode 157. A part of the bottom gate electrode 153 is opposed to the top gate electrode 157 (a part thereof) and another part of the bottom gate electrode 153 is opposed to the storage capacitor electrode 191.

As will be described later, the storage capacitor electrode 191 is an impurity-doped semiconductor and formed on the same layer as the semiconductor area of the driving TFT T1. The storage capacitor electrode 191 is formed not to overlap with the top gate electrode 157. The storage capacitor electrode 191 is formed in the same process as the semiconductor area of the driving TFT T1. Furthermore, the storage capacitor electrode 191 and the semiconductor area of the driving TFT T1 are doped with impurities together by a self-aligned process without using a mask.

A scanning line 106 overlaps with the switching TFT T2 to function as the gate of the switching TFT T2. Scanning lines 106 are disposed to extend in the horizontal direction and to be regularly distant from one another in the vertical direction. Each pixel row is supplied with a scanning signal from one scanning line 106.

The source of the switching TFT T2 is connected with a data line 105 through a contact 171. The contact 171 interconnects the source of the switching TFT T2 and the data line 105. Data lines 105 are disposed to extend in the vertical direction and to be regularly distant from one another in the horizontal direction. Each pixel column is supplied with control signals specifying the luminance of the sub-pixels from three data lines 105.

Figure 3B:
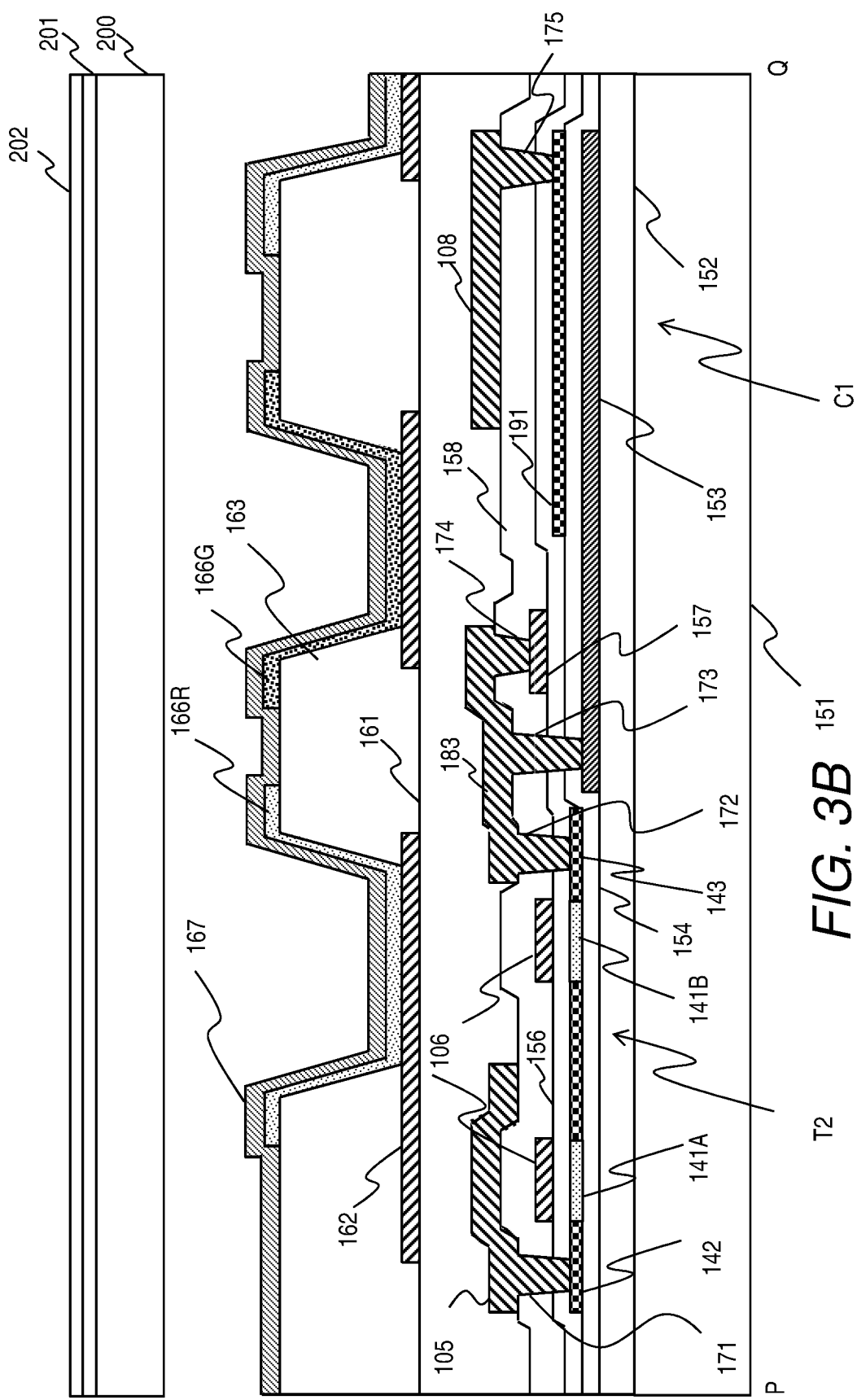
FIG. 3B is a cross-sectional diagram cut along the line P-Q in FIG. 3A.

FIG. 3B is a cross-sectional diagram cut along the line P-Q in FIG. 3A. FIG. 3C is a cross-sectional diagram cut along the line R-S in FIG. 3A. The vertical direction in the following description corresponds to the vertical direction in the drawings, which is the stacking direction of the multi-layered film. The horizontal direction in the following description corresponds to the horizontal direction in the drawings. For convenience of visibility, the hatching patterns of the elements in FIG. 3B are different from those in FIG. 3A.

FIG. 3B mainly illustrates the structure of an OLED element and the structures of the switching TFT T2 and the storage capacitor C1 of a pixel circuit schematically. The OLED element and the pixel circuit are provided between the insulating substrate 151 and the encapsulation substrate 200.

The OLED element includes a lower electrode (such as the anode electrode 162), an upper electrode (such as the cathode electrode 167), and an organic light-emitting film. FIG. 3B includes an organic red light emitting film 166R and an organic green light emitting film 166G. Illustrated in FIG. 3B are examples of top-emission type of sub-pixels, in which the cathode electrode 167 is a transparent electrode that transmits light from the organic light-emitting film toward the encapsulation substrate 200. The sub-pixels can be of bottom-emission type.

The cathode electrode 167 has a shape fully covering the entire display region 125. The anode electrode 162 is formed separately for an individual sub-pixel. Part of the light from an organic light-emitting film is reflected by the anode electrode 162, passes through the cathode electrode 167 and the encapsulation substrate 200, and goes out to the display surface of the display device 10. The sub-pixel may have a structure in which the anode electrode is an upper electrode and the cathode electrode is a lower electrode.

A bottom gate electrode 153 is provided above the insulating substrate 151 with an insulating layer 152 interposed. A lower gate insulating layer (first gate insulating layer) 154 is provided over the bottom gate electrode 153. Above the lower gate insulating layer 154, the semiconductor area of the switching TFT T2 and the storage capacitor electrode 191 of the storage capacitor C1 are provided. The semiconductor area and the storage capacitor electrode 191 are on the same layer (semiconductor layer) and are made of low-temperature polysilicon (LTPS), for example.

The semiconductor area includes a source 142, channel areas 141A and 141B, and a drain 143. The source 142 and the drain 143 are made of LTPS doped with high-concentration impurities. In this example, the source 142 and the drain 143 are p-type semiconductors. The channel areas 141A and 141B between the source 142 and the drain 143 are i-type semiconductors.

The storage capacitor electrode 191 is made of LTPS doped with high-concentration impurities, like the source 142 and the drain 143. The storage capacitor electrode 191 is disposed to be opposite to the bottom gate electrode 153 in the stacking direction. The storage capacitor electrode 191, the bottom gate electrode 153, and the lower gate insulating layer 154 sandwiched by the storage capacitor electrode 191 and the bottom gate electrode 153 constitute the storage capacitor C1.

An upper gate insulating layer (second gate insulating layer) 156 is provided over the semiconductor area of the switching TFT T2 and the storage capacitor electrode 191. Above the upper gate insulating layer 156, a scanning line 106 is provided to cover the channel areas 141A and 141B. The scanning line 106 is the gate electrode of the switching TFT T2 and is opposed to the channel areas 141A and 141B with the upper gate insulating layer 156 interposed.

The top gate electrode 157 of the driving TFT T1 is provided on the same layer as the scanning line 106. As illustrated in FIG. 3A, the top gate electrode 157 includes an area opposed to the semiconductor area of the driving TFT T1 and an arm area extending from the driving TFT T1 toward the switching TFT T2.

An interlayer insulating layer 158 is provided above the layer of the scanning line 106 and the top gate electrode 157 of the driving TFT T1. Above the interlayer insulating layer 158, a data line 105, an electrode 183, and a power line 108 are provided. These are provided on the same layer and distant from one another. A contact 171 provided in a contact hole of the interlayer insulating layer 158 interconnects the data line 105 and the source 142 of the switching TFT T2. A contact 175 provided in another contact hole of the interlayer insulating layer 158 interconnects the power line 108 and the storage capacitor electrode 191.

Furthermore, contacts 172, 173, and 174 provided in other three contact holes of the interlayer insulating layer 158 interconnect the electrode 183 with the drain 143 of the switching TFT T2, the bottom gate electrode 153 of the driving TFT T1, and the top gate electrode 157 of the driving TFT T1, respectively. The bottom gate electrode 153 is shorted with the top gate electrode 157 and has the same potential as the top gate electrode 157.

An insulative planarization layer 161 is provided above the layer of the data line 105, the electrode 183, and the power line 108. Above the insulative planarization layer 161, anode electrodes 162 are provided. An insulative pixel defining layer (PDL) 163 for isolating OLED elements is provided above the anode electrodes 162.

An OLED element is composed of an anode electrode 162, an organic light-emitting film 166R or 166G, and the cathode electrode 167 (a part thereof) stacked together. The OLED element is formed in an opening of the pixel defining layer 163. As noted from this description, the openings of the pixel defining layer 163 define the light-emitting regions of sub-pixels.

An organic light-emitting film 166R or 166G is provided above an anode electrode 162. Each of the organic light-emitting films 166R and 166G is deposited on the pixel defining layer 163 in an opening of the pixel defining layer 163 and its periphery. A cathode electrode 167 is provided over the organic light-emitting films 166R and 166G.

The cathode electrode 167 is a transparent electrode. The cathode electrode 167 transmits all or part of the visible light from the organic light-emitting films 166R and 166G. A cap layer may be provided over the cathode electrode 167.

One organic light-emitting film is provided between one cathode electrode 167 and one anode electrode 162. Describing in more detail, a plurality of anode electrodes 162 are provided on the same plane (for example, on the planarization layer 161) and one organic light-emitting film is provided above one anode electrode 162.

The encapsulation substrate 200 is fixed at a predetermined distance from the TFT substrate 100. The encapsulation substrate 200 is a transparent insulating substrate, which can be made of glass. A space is held between the TFT substrate 100 and the encapsulation substrate 200 and a gas such as dry air is tightly packed therein. Such an air-tight structure prevents moisture from entering and damaging the organic light-emitting elements. A λ/4 plate 201 and a polarizing plate 202 are provided over the light emission surface (front face) of the encapsulation substrate 200 to prevent reflection of light entering from the external.

An encapsulation structural unit different from the encapsulation substrate 200 can be used, such as a thin film encapsulation (TFE) structural unit having a stacked structure of an inorganic film and an organic film or a structure that covers the whole area with a flexible or inflexible encapsulation substrate made of a material having high resistance to water permeation.

The device structure of the OLED in this disclosure is so-called top emission type. In the case of top emission type, part of the light from an organic light-emitting film is reflected by the anode electrode 162, passes through the cathode electrode 167 and the encapsulation substrate 200, and reaches the display surface of the display device 10. In the case where the OLED element has a cavity structure, the light from the organic light-emitting film is repeatedly reflected between the reflective anode electrode 162 and a semi-transmissive cathode electrode 167. This multi-reflection yields resonance effect that amplifies the light having a resonant wavelength. The light in which the wavelength component of the color of the sub-pixel has been enhanced by the resonance effects goes out from the semi-transmissive transparent cathode electrode 167 toward the display surface of the display device 10.

FIG. 3C mainly illustrates a structure of the driving TFT T1 of a pixel circuit schematically. The driving TFT T1 has a dual gate structure. A bottom gate electrode 153 is provided above the insulating substrate 151 with an insulating layer 152 interposed. A lower gate insulating layer 154 is provided over the bottom gate electrode 153.

Above the lower gate insulating layer 154, the semiconductor area of the driving TFT T1 is provided. The semiconductor area of the driving TFT T1 is on the same layer as the semiconductor area of the switching TFT T2 and is made of LTPS.

The semiconductor area includes a source 147, a channel 145, and a drain 146. The source 147 and the drain 146 are made of LTPS doped with high-concentration impurities. In this example, the source 147 and the drain 146 are made of a p-type semiconductor. The channel 145 sandwiched by the source 147 and the drain 146 is made of an i-type semiconductor.

A top gate electrode 157 is provided to cover the channel 145 with an upper gate insulating layer 156 interposed. The channel 145 is sandwiched by the top gate electrode 157 and the bottom gate electrode 153. This dual gate structure significantly reduces the hysteresis of the TFT that causes image retention.

In the example of FIG. 3C, the width (the dimension in the horizontal direction) of the bottom gate electrode 153 is larger than the width of the top gate electrode 157. It can be equal to or smaller than the width of the top gate electrode 157.

In an example, the thickness of the lower gate insulating layer 154 is not larger than or smaller than the thickness of the upper gate insulating layer 156. Such a configuration further diminishes the hysteresis characteristics of the driving TFT T1.

A process to manufacture the driving TFT T1 serially forms the layers from the bottom layer to the top layer. The process damage to the lower gate insulating layer 154 is smaller than the process damage to the upper gate insulating layer 156. A thinner lower gate insulating layer 154 leads to attainment of other good characteristics of the driving TFT T1 in addition to the smaller hysteresis characteristics.

An interlayer insulating layer 158 is provided above the layer of the top gate electrode 157. Above the interlayer insulating layer 158, an electrode 181 and a power line 108 are provided on the same layer. The power line 108 is connected with the source 147 through a contact 177 provided in a contact hole passing through the upper gate insulating layer 156 and the interlayer insulating layer 158. The contact 177 interconnects the power line 108 and the source 147.

An insulative planarization layer 161 is provided above the layer of the electrode 181 and the power line 108. Above the insulative planarization layer 161, an anode electrode 162 is provided. The anode electrode 162 is connected with the drain 146 of the driving TFT T1 through the electrode 181.

The electrode 181 is connected with the anode electrode 162 through a contact 178 provided in a contact hole in the planarization layer 161. The contact 178 interconnects the electrode 181 and the anode electrode 162. As illustrated in FIG. 3A, the anode electrode 162 is connected with the contact 178 at a part that does not overlap with the organic light-emitting film.

The electrode 181 is further connected with the drain 146 through a contact 176 provided in a contact hole passing through the upper gate insulating layer 156 and the interlayer insulating layer 158. The contact 176 interconnects the electrode 181 and the drain 146.

Manufacturing Method

A method of manufacturing the OLED display device 10 is outlined. In the following description, the elements formed in the same step (together) are the elements on the same layer. The method of manufacturing the OLED display device 10 first deposits silicon nitride, for example, onto an insulating substrate 151 made of glass by chemical vapor deposition (CVD) to form an insulating layer 152.

Figure 4A:
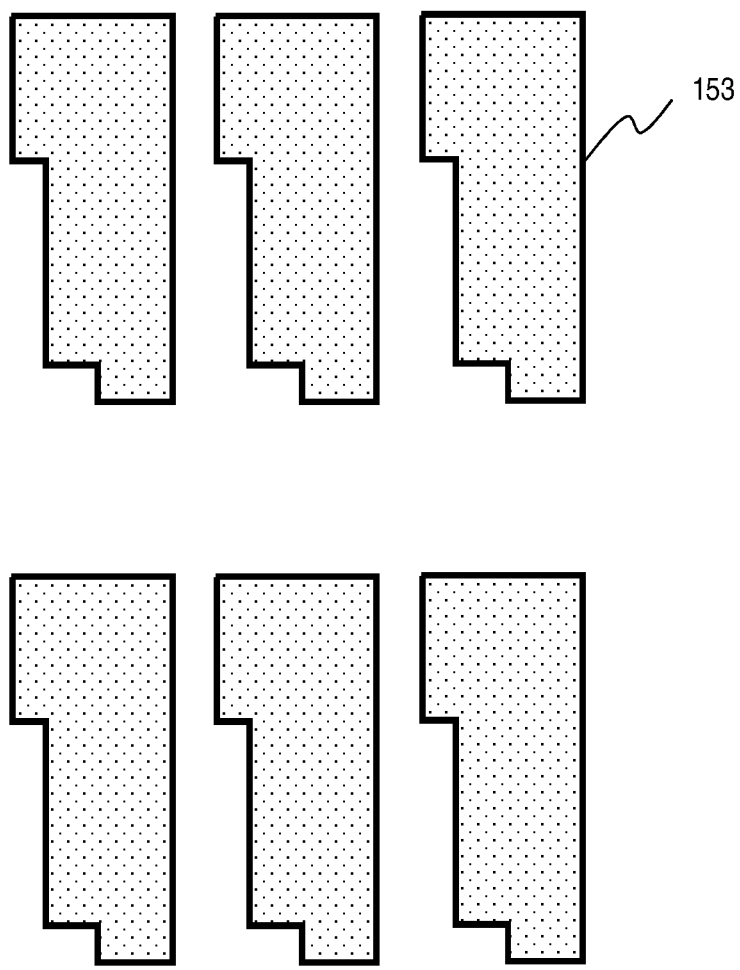
FIG. 4A illustrates an example of a pattern of bottom gate electrodes.

Next, the method deposits a metal on the insulating layer 152 by sputtering and patterns the metal to form bottom gate electrodes 153. FIG. 4A illustrates an example of the pattern of the bottom gate electrodes 153. The metal can be Mo, Nb, W, an alloy of Mo and Nb, or an alloy of Mo and W.

Next, the method deposits silicon nitride, for example, onto the bottom gate electrodes 153 and the insulating layer 152 by CVD to form a lower gate insulating layer 154. Next, the method forms a polysilicon layer by a known low-temperature polysilicon TFT fabrication technique. For example, the method can form the polysilicon layer by depositing amorphous silicon by CVD and crystallizing the amorphous silicon by excimer laser annealing (ELA).

Figure 4B:
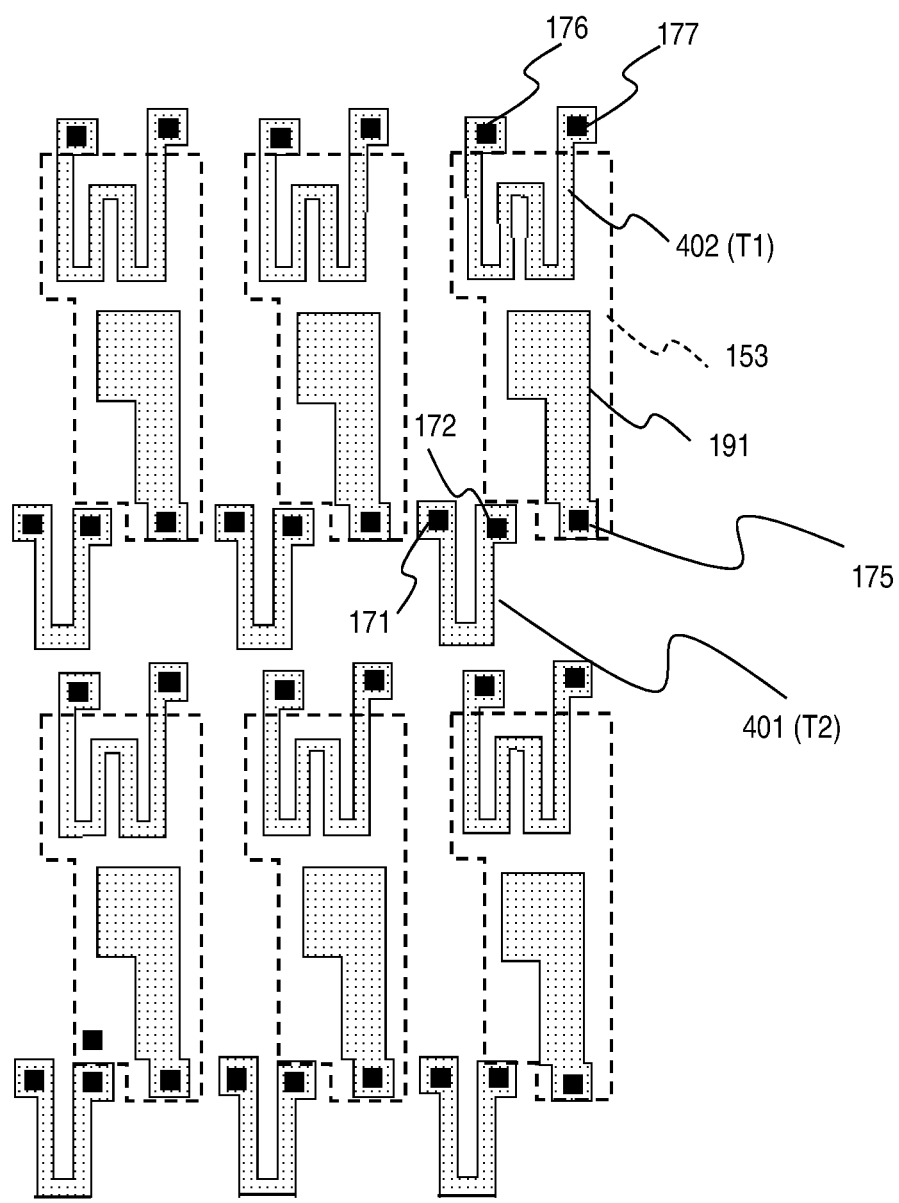
FIG. 4B illustrates a pattern of a polysilicon layer.

FIG. 4B illustrates a pattern of the polysilicon layer (semiconductor layer). The polysilicon layer includes the semiconductor areas 401 of switching TFTs T2, the semiconductor areas 402 of driving TFTs T1, and storage capacitor electrodes 191. FIG. 4B includes some unprovided contacts together with the pattern of the polysilicon layer for convenience of understanding.

FIG. 4B further includes the pattern of the bottom gate electrodes 153 as indicated by dashed lines. Although the storage capacitor electrodes 191 are made of polysilicon doped with high-concentration impurities, the pre-doped polysilicon is also referred to as storage capacitor electrodes 191 for convenience of explanation.

As illustrated in FIG. 4B, each bottom gate electrode 153 is opposed to the semiconductor area 402 of a driving TFT T1 and a storage capacitor electrode 191. In other words, the semiconductor area 402 (a part thereof) of a driving TFT T1 overlaps with a part of a bottom gate electrode 153 and a storage capacitor electrode 191 overlaps with another part of the bottom gate electrode 153 in the stacking direction. In the example of FIG. 4B, the entire storage capacitor electrode 191 is included in the bottom gate electrode 153 when seen in the stacking direction.

Next, the method deposits silicon oxide, for example, onto the polysilicon layer and the lower gate insulating layer 154 by CVD to form an upper gate insulating layer 156. Furthermore, the method deposits a metal by sputtering and patterns the metal to form an M1 metal layer including top gate electrodes 157 and scanning lines 106. Examples of the metal for the M1 metal layer are Mo, W, Nb, MoW, MoNb, Al, Nd, Ti, Cu, a Cu alloy, an Al alloy, Ag, or an Ag alloy. The metal layer can be a single layer or multiple layers.

Figure 4C:
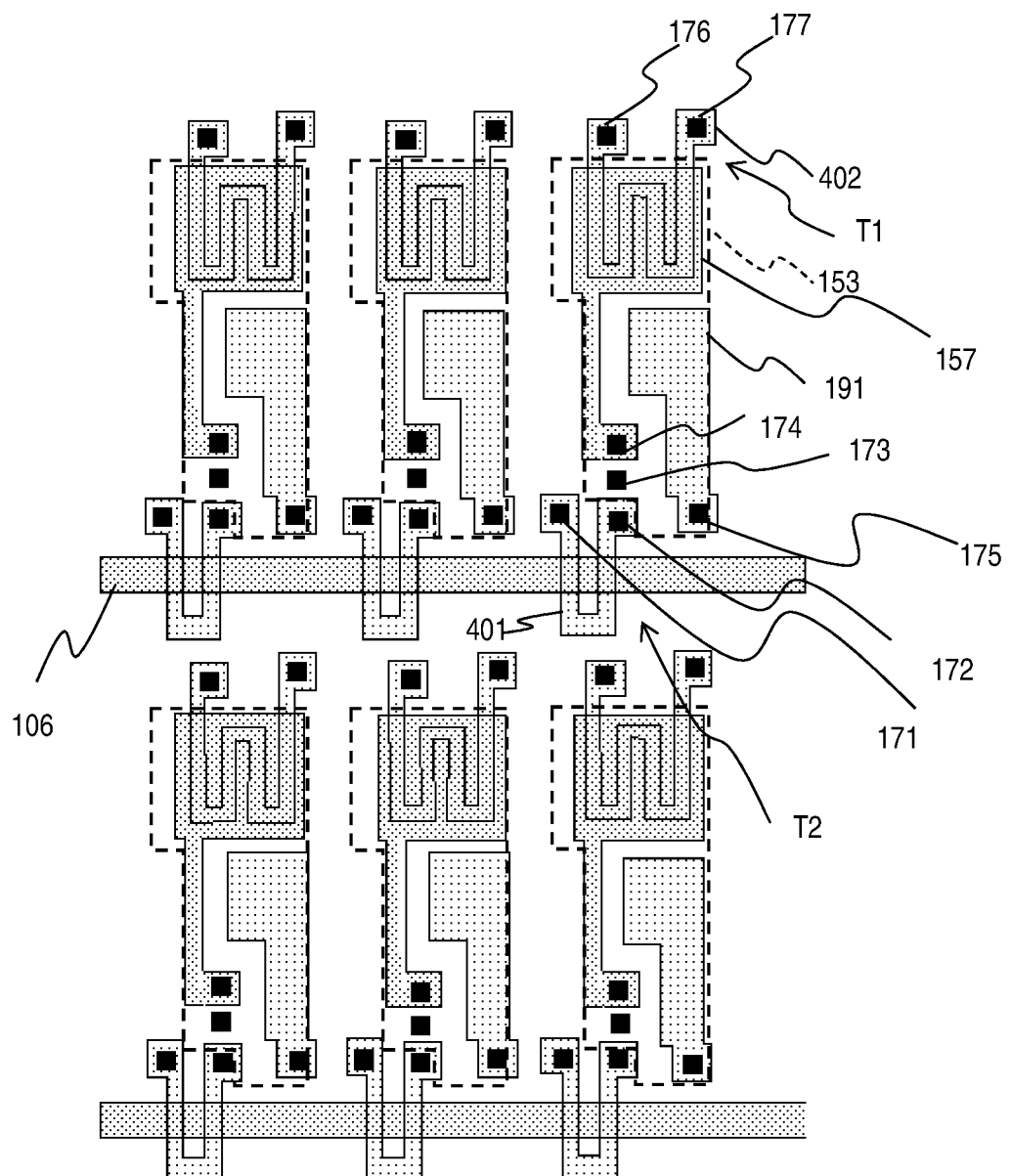
FIG. 4C illustrates an M1 metal layer including top gate electrodes and scanning lines together with the patterns of a polysilicon layer and bottom gate electrodes on the lower layers.

FIG. 4C illustrates the M1 metal layer including top gate electrodes 157 and scanning lines 106 together with the patterns of the polysilicon layer and the bottom gate electrodes 153 on the lower layers. FIG. 4C includes some unprovided contacts for convenience of understanding.

Each top gate electrode 157 includes an area opposed to the semiconductor area 402 and the bottom gate electrode 153 of the driving TFT T1 and an arm area extending from the driving TFT T1 toward the switching TFT T2. A part of the semiconductor area 402 does not overlap with the top gate electrode 157 but is exposed in the outside of the top gate electrode 157. The storage capacitor electrode 191 does not overlap with the top gate electrode 157 but is formed in the outside of the area covered by the top gate electrode 157.

Each scanning line 106 is opposed to the semiconductor areas 401 of the switching TFTs T2. A part of the semiconductor area 401 of each switching TFT T2 does not overlap with a scanning line 106 and is exposed in the outside of the scanning line 106.

Next, the method dopes the semiconductor layer with high-concentration impurities by ionic implantation using the top gate electrodes 157 and the scanning lines 106 as a mask (self-aligned process). The impurities include elemental boron or aluminum, for example.

Through this doping step, the sources 142 and the drains 143 of switching TFTs T2 and the sources 147 and the drains 146 of driving TFTs T1 are produced and the storage capacitor electrodes 191 are completed. Since the storage capacitor electrodes 191 are exposed in the outside of the top gate electrodes 157 as described above, impurities are applied through the self-aligned doping process.

Forming the storage capacitor electrodes 191 together with the semiconductor areas of the dual-gate driving TFTs on the same layer by the same process facilitates the manufacture of storage capacitor electrodes 191 of the storage capacitors for the gate electrodes of the dual-gate driving TFTs. Furthermore, forming the storage capacitor electrodes 191 outside the areas overlapped with the top gate electrodes 157 in the stacking direction and doping them with impurities by a self-aligned process eliminates increase in number of masks to be used.

Next, the method deposits silicon oxide, for example, by CVD to form an interlayer insulating layer 158. The method opens contact holes in the interlayer insulating layer 158, the upper gate insulating layer 156, and the lower gate insulating layer 154 by anisotropic etching.

Figure 4D:
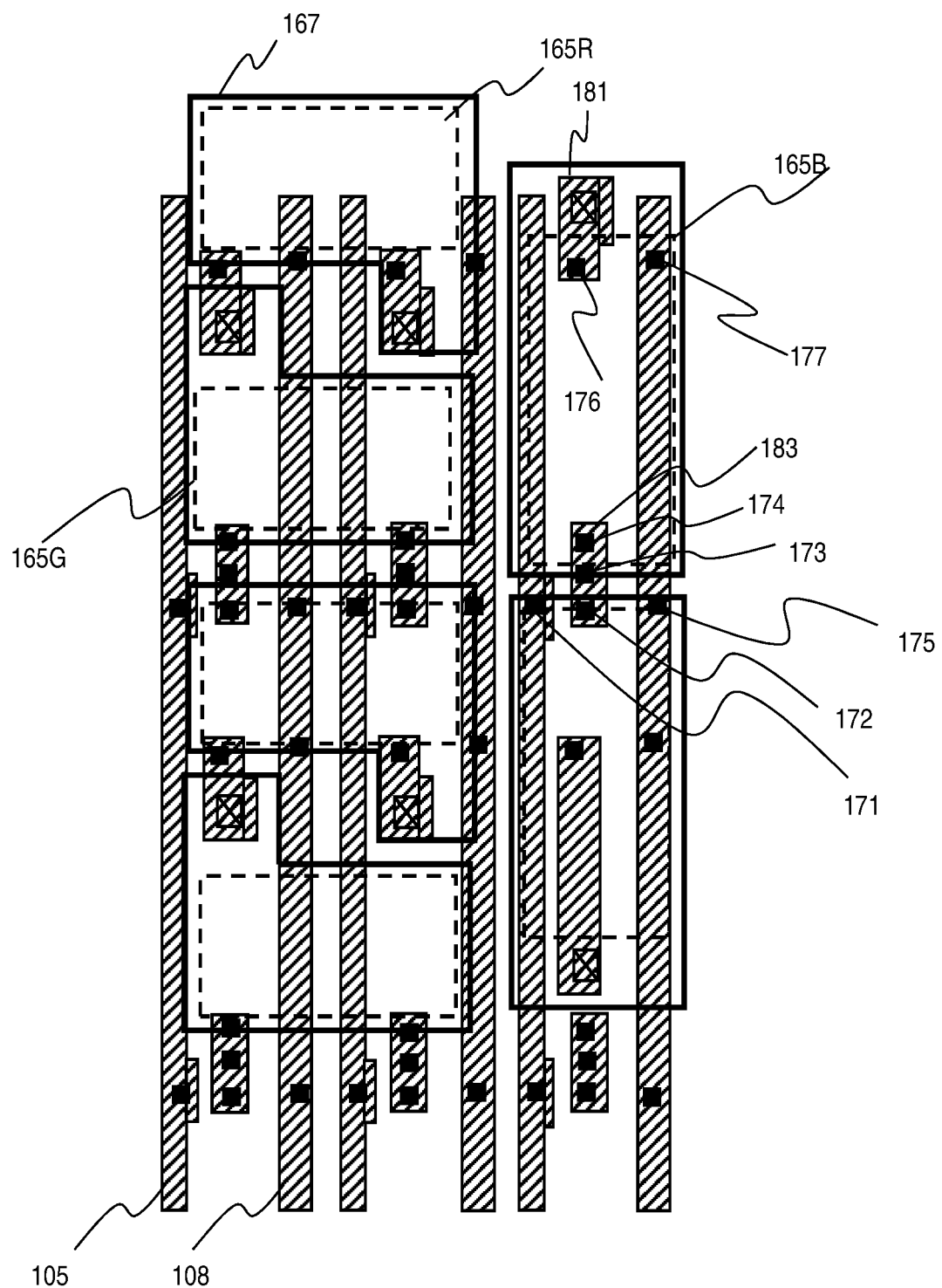
FIG. 4D illustrates a pattern of an M2 metal layer.

Next, the method deposits an aluminum alloy such as Ti/Al/Ti by sputtering and patterns the alloy to form an M2 metal layer. FIG. 4D illustrates a pattern of the M2 metal layer. The M2 metal layer includes data lines 105, power lines 108, electrodes 181 and 183, and contacts 171 to 177.

Next, the method deposits a photosensitive organic material to form a planarization layer 161 and subsequently, opens contact holes for connecting anode electrodes 162 and the drains 146 of the driving TFTs. The method forms anode electrodes 162 on the planarization layer 161 provided with contact holes. Each anode electrode 162 is connected to the drain 146 of a driving TFT through a contact 178, an electrode 181, and a contact 176.

An anode electrode 162 includes three layers of a transparent film made of ITO, IZO, ZnO, $In_2O_3$, or the like, a reflective film made of Ag, Mg, Al, Pt, Pd, Au, Ni, Nd, Ir, Cr, or a metallic compound thereof, and another transparent film as mentioned above. The three-layer structure of the anode electrode 162 is merely an example and the anode electrode 162 may have a two-layer structure.

Next, the method deposits a photosensitive organic resin, for example, by spin coating and patterns the photosensitive organic resin to form a pixel defining layer 163. The patterning creates holes in the pixel defining layer 163; the anode electrodes 162 of the sub-pixels are exposed at the bottom of the created holes. The pixel defining layer 163 isolates individual light emitting regions of sub-pixels.

Next, the method applies an organic light-emitting material onto the insulating substrate 151 provided with the pixel defining layer 163 to form an organic light-emitting film (organic light-emitting layer). An organic light-emitting film is formed by depositing an organic light-emitting material for the color of R, G, or B on anode electrodes 162 through a metal mask, for example.

In the case of selectively depositing organic light emitting materials with metal masks, the method sets metal masks having openings a little larger than light-emitting regions on the insulating substrate 151 in correct alignment one after another to selectively deposit the organic light-emitting materials for individual colors. Since the electric current flows only within the openings of the pixel defining layer 163, these regions become light-emitting regions.

An example of the organic light-emitting film consists of a hole injection layer, a hole transport layer, a light emitting layer, an electron transport layer, and an electron injection layer in this order from the bottom. The organic light-emitting film may have any structure selected from electron transport layer/light emitting layer/hole transport layer, electron transport layer/light emitting layer/hole transport layer/hole injection layer, electron injection layer/electron transport layer/light emitting layer/hole transport layer, and single light emitting layer. The materials of the light emitting layers are different depending on the color of the sub-pixel; the film thicknesses of the hole injection layer and the hole transport layer are controlled depending on the color.

Next, the method applies a metal for the cathode electrode 167 onto the TFT substrate 100 where the pixel defining layer 163 and the organic light-emitting films (in the openings of the pixel defining layer 163) are exposed. The metal deposits on the organic light-emitting films.

The layer of the transparent cathode electrode 167 is formed by vapor-depositing Li, Ca, LiF/Ca, LiF/Al, Al, Mg, or an alloy thereof, for example. The film thickness of the cathode electrode 167 is optimized to increase the light-extraction efficiency and ensure better view angle dependence. If the resistance of the cathode electrode 167 is so high that the uniformity of the luminance of the emitted light is impaired, an additional auxiliary electrode layer may be formed of a material for a transparent electrode, such as ITO, IZO, ZnO, or $In_2O_3$. To increase the light extraction efficiency, the method may form a cap layer by depositing an insulator having a refractive index higher than glass after forming the cathode electrode 167.

Through the foregoing processes, OLED elements corresponding to R, G, and B sub-pixels are formed; the areas where the anode electrodes 162 are in contact with the organic light-emitting films (within the openings in the pixel defining layer 163) become red light emitting regions 165R, green light emitting regions 165G, and blue light emitting regions 165B.

Next, the method applies glass frit to the periphery of the TFT substrate 100, places an encapsulation substrate 200 thereon, and heats and melts the glass frit with a laser beam to seal the TFT substrate 100 and the encapsulation substrate 200. Thereafter, the method forms a λ/4 plate 201 and a polarizing plate 202 on the light emission side of the encapsulation substrate 200 to complete the fabrication of the display device 10.

Other Configuration Examples

Figure 5:
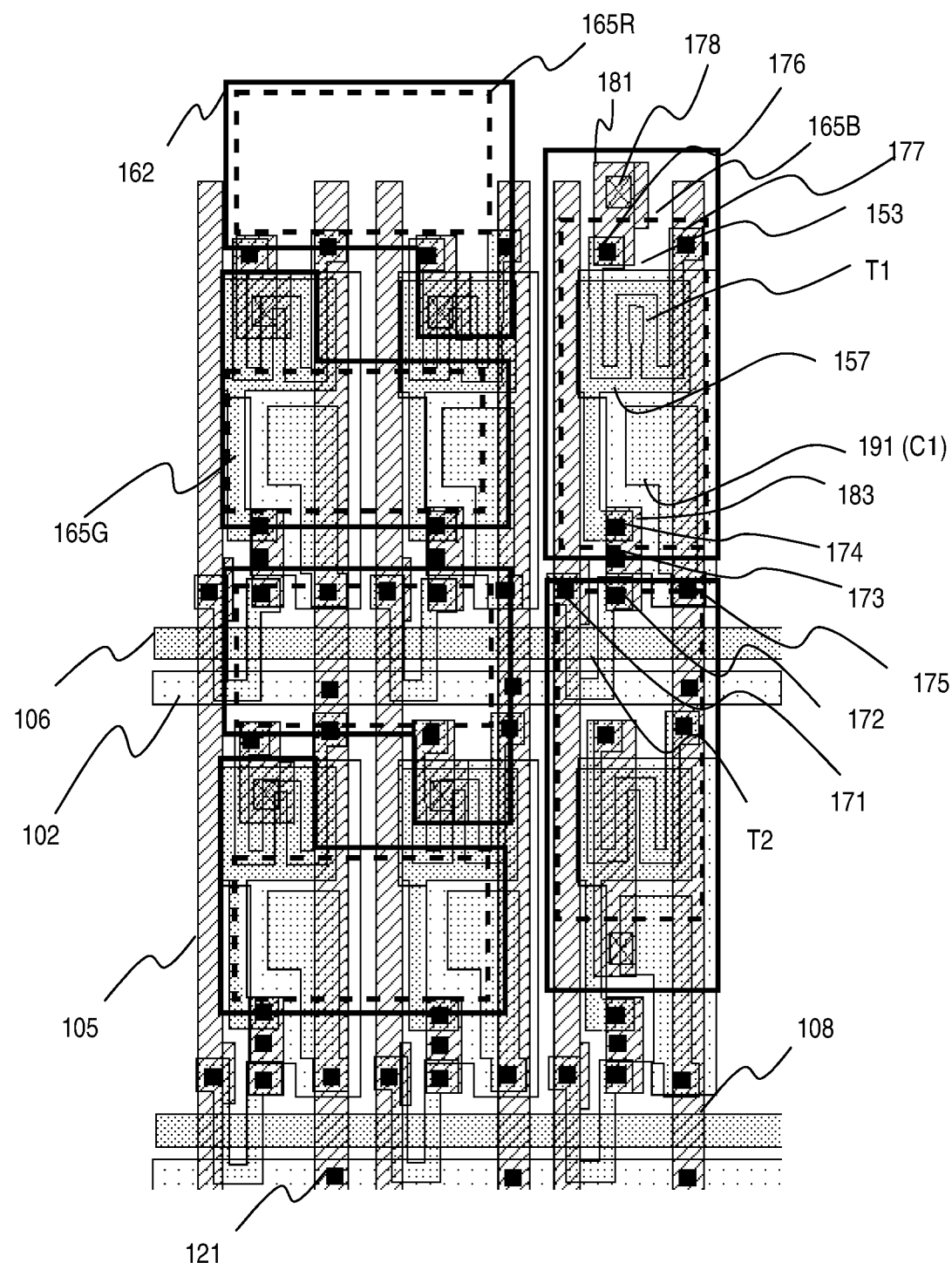
FIG. 5 illustrates another configuration example of the display region.

FIG. 5 illustrates another configuration example of the display region 125. The display region 125 includes auxiliary power lines 102 in addition to the configuration illustrated in FIG. 3A. The auxiliary power lines 102 are formed by the same process and on the same layer as the bottom gate electrodes 153. The auxiliary power lines 102 are disposed to extend in the horizontal direction (row direction) and be distant from one another in the vertical direction (column direction), like the scanning lines 106.

Each auxiliary power line 102 is connected with the power lines 108 through contacts 121 passing through the lower gate insulating layer 154, the upper gate insulating layer 156, and the interlayer insulating layer 158. Each contact 121 interconnects a power line 108 and the auxiliary power line 102. The contact 121 may be connected with a storage capacitor electrode 191 (doped semiconductor area).

The auxiliary power lines 102 and the power lines 108 disposed in a mesh achieves giving more stable potentials to the driving TFTs T1.

Although the example of FIG. 5 provides auxiliary power lines 102 adjacent to scanning lines 106, the auxiliary power lines 102 may be provided at other places. The number of auxiliary power lines 102 may be equal to, more than, or less than the number of scanning lines 106. Each auxiliary power line 102 may be connected with all power lines 108 at contacts 121 or a part of the power lines 108 at contacts 121.

Figure 6A:
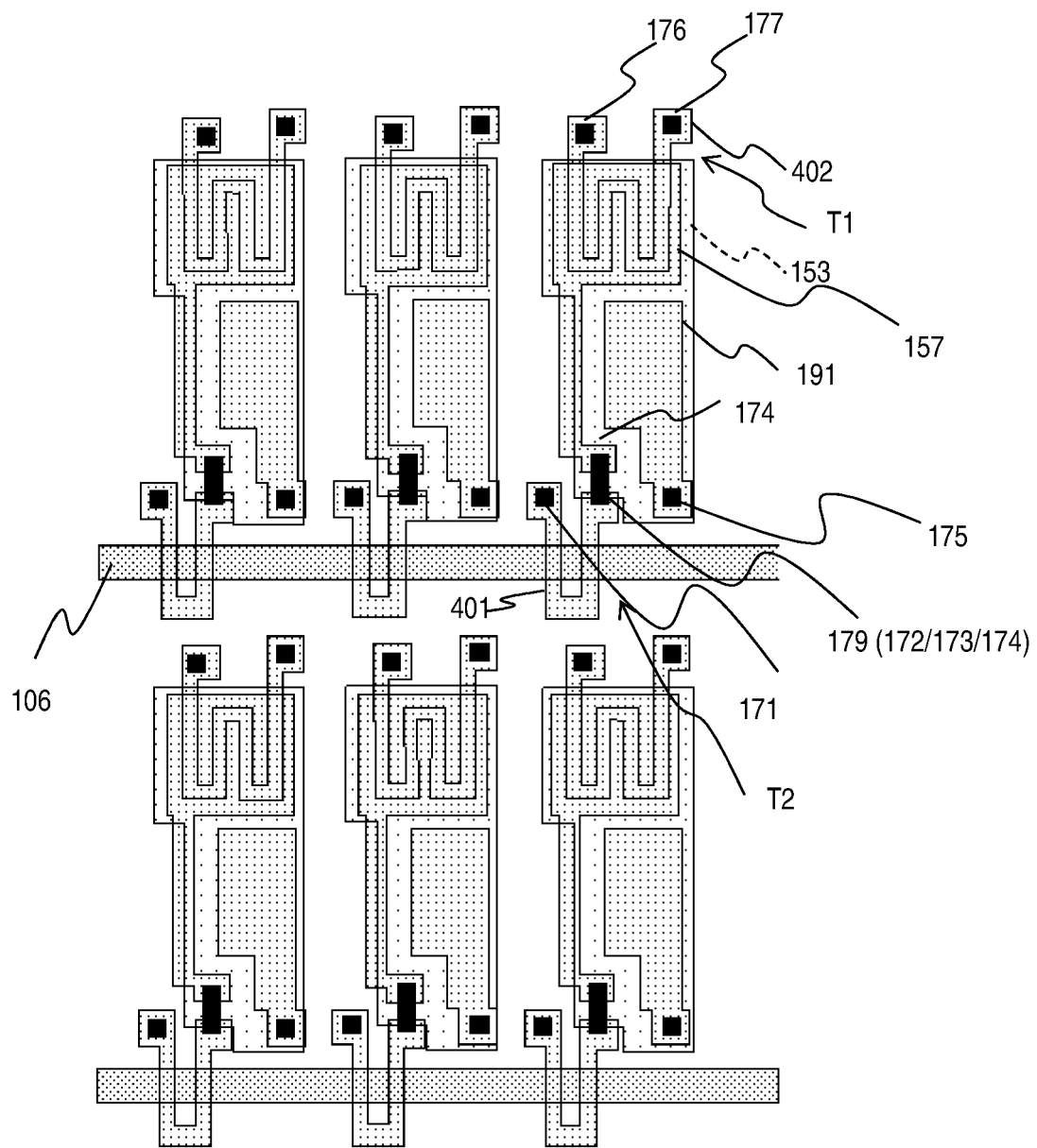
FIG. 6A is a plan diagram of another configuration example of the pixel circuit.
Figure 6B:
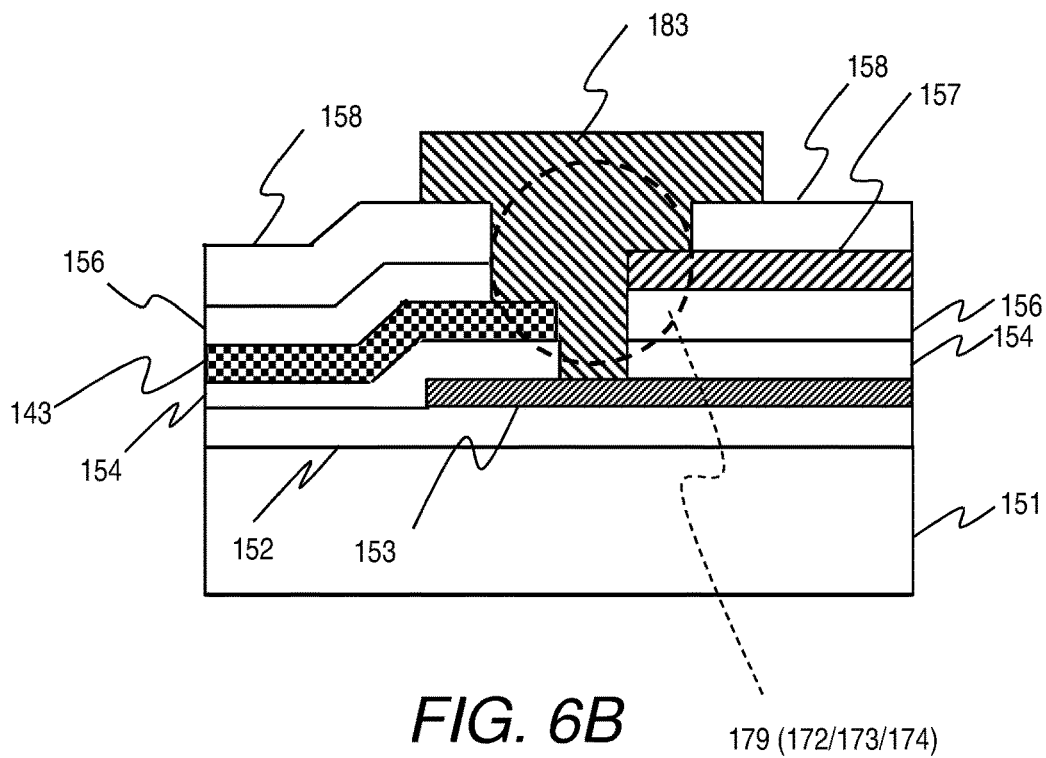
FIG. 6B is a cross-sectional diagram of the other configuration example of the pixel circuit.

FIGS. 6A and 6B illustrate another configuration example of the pixel circuit. In this configuration example, the top gate electrode 157, the drain 143 of the switching TFT T2, and the bottom gate electrode 153 are interconnected through a single contact 179 provided in a single contact hole. The contact 179 is a contact unifying the contacts 172, 173 and 174 shown in FIG. 3B. The contact hole passing through three insulating layers is created by single etching.

Interconnecting the M2 metal layer, the polysilicon layer, and the M1 metal layer through a single contact reduces the area occupied by contacts. As a result, the storage capacitor electrode and the storage capacitor can be enlarged.

Figure 7:
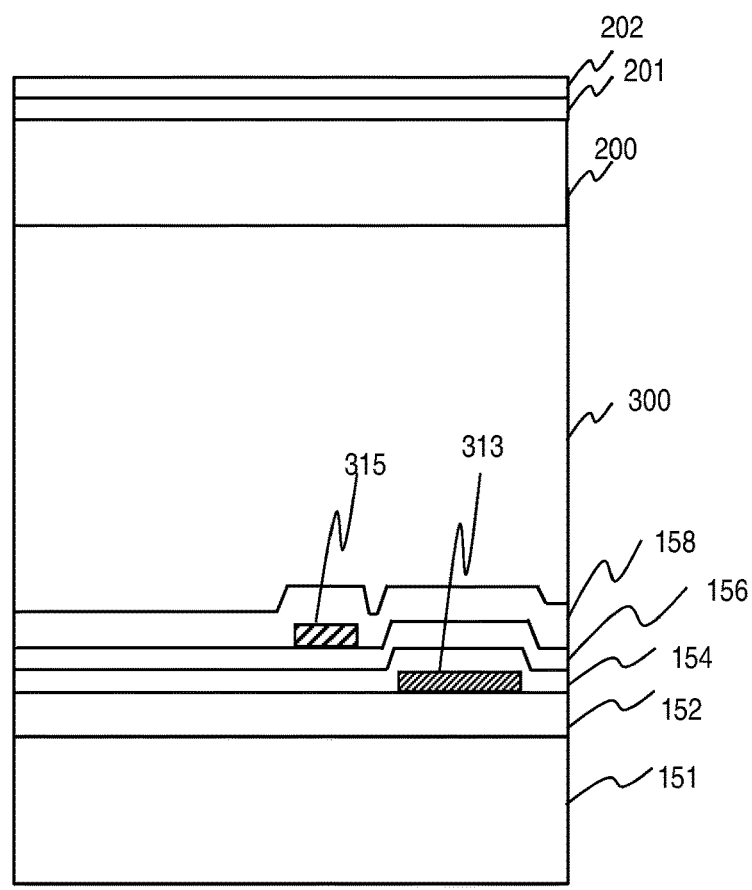
FIG. 7 illustrates an example of wires for a scanning driver provided under a glass frit sealer.

FIG. 7 illustrates an example of wires for the scanning driver provided under the bond (glass frit sealer) 300. The scanning driver 131 and the display region 125 are provided inner than the bond 300 (in FIG. 7, on the right of the drawing).

The wires for the scanning driver includes a lower wiring layer 313 on the same layer as the bottom gate electrodes 153 and an upper wiring layer 315 on the same layer as the top gate electrodes 157 (M1 metal layer). Between the lower wiring layer 313 and the substrate 151, the insulating layer 152 is provided. Between the lower wiring layer 313 and the upper wiring layer 315, the lower gate insulating layer 154 and the upper gate insulating layer 156 are provided. Between the upper wiring layer 315 and the bond 300, the interlayer insulating layer 158 is provided in contact with those.

This configuration such that the wires for the scanning driver are provided in the overlap area with the bond 300 or between the bond 300 and the substrate 151, where a part of the wires are disposed on the M1 layer and the rest of the wires are disposed on the same layer as the bottom gate electrodes 153, enables achievement of a slim bezel.

Manufacturing the OLED display device 10 applies glass frit to cover the lower gate insulating layer 154 and the upper gate insulating layer 156, places the encapsulation substrate 200 thereon, heats and melts the glass frit with a laser beam to seal the TFT substrate 100 and the encapsulation substrate 200.

Since the bond (glass frit) 300 is heated and melted with a laser beam, the lower wiring layer 313 (the layer including bottom gate electrodes 153) and the upper wiring layer 315 (the M1 metal layer including top gate electrodes 157) are made of a metal having a high melting point, such as Mo (molybdenum), Nb (niobium), W (tungsten), or an alloy of a metal having a high melting point.

As set forth above, embodiments of this disclosure have been described; however, this disclosure is not limited to the foregoing embodiments. Those skilled in the art can easily modify, add, or convert each element in the foregoing embodiment within the scope of this disclosure. A part of the configuration of one embodiment may be replaced with a configuration of another embodiment or a configuration of an embodiment may be incorporated into a configuration of another embodiment.

What is claimed is:

1. A circuit configured to control intensity of light to be emitted from a pixel of an OLED display device, the circuit comprising:
a first thin film transistor configured to supply electric current to an organic light-emitting film, and
a storage capacitor configured to maintain gate potential of the first thin film transistor,
wherein the first thin film transistor includes:
a bottom gate electrode;
a channel provided on a layer above the bottom gate electrode to overlap with a first part of the bottom gate electrode;
a first gate insulating layer provided between the channel and the bottom gate electrode;
a top gate electrode provided on a layer above the channel to overlap with the channel and connected with the bottom gate electrode; and
a second gate insulating layer provided between the channel and the top gate electrode, and
wherein the storage capacitor includes:
a second part of the bottom gate electrode, and
storage capacitor electrode made of an impurity semiconductor included in a same layer as the channel, and provided to overlap with the second part of the bottom gate electrode with the first gate insulating layer interposed therebetween without overlapping the top gate electrode.

2. The circuit according to claim 1, wherein a thickness of the first gate insulating layer is equal to or smaller than a thickness of the second gate insulating layer.

3. The circuit according to claim 1, further comprising a second thin film transistor configured to supply a signal to the gate of the first thin film transistor and the storage capacitor,
wherein the second thin film transistor includes a semiconductor area on the same layer as the channel of the first thin film transistor,
wherein the semiconductor area includes a channel of the second thin film transistor and an impurity-doped area continued to the channel of the second thin film transistor, and
wherein the impurity-doped area, the bottom gate electrode of the first thin film transistor, and the top gate electrode of the first thin film transistor are interconnected through a common contact hole.

4. The circuit according to claim 3,
wherein the first thin film transistor and the second thin film transistor are disposed on a first substrate in an area more inward than a bond bonding the first substrate and a second substrate opposed to the first substrate,
wherein, the circuit further comprises:
a driver circuit for the second thin film transistor;
a first wiring layer for the driver circuit provided on the same layer as the bottom gate electrode; and
a second wiring layer for the driver circuit provided on the same layer as the top gate electrode, and
wherein the first and the second wiring layers are provided under the bond.

5. The circuit according to claim 1, further comprising:
a plurality of power lines extending in a first direction and being distant from one another on a layer above the top gate electrode; and
a plurality of auxiliary power lines extending in a second direction different from the first direction on the same layer as the bottom gate electrode, the plurality of auxiliary power lines being connected with the plurality of power lines through contacts.

6. An OLED display device comprising:
a plurality of pixels arrayed on a first substrate, each of the plurality of pixels including an organic light-emitting film and a lower electrode and an upper electrode sandwiching the organic light-emitting film; and
a plurality of pixel circuits, each of the plurality of pixel circuits being configured to control intensity of light to be emitted from one of the plurality of pixels by controlling electric current to be supplied to the pixel,
wherein each of the plurality of pixel circuits includes:
a first thin film transistor configured to supply electric current to the organic light-emitting film through the lower electrode; and
a storage capacitor configured to maintain gate potential of the first thin film transistor,
wherein the first thin film transistor includes:
a bottom gate electrode;
a channel provided on a layer above the bottom gate electrode to overlap with a first part of the bottom gate electrode;
a first gate insulating layer provided between the channel and the bottom gate electrode;
a top gate electrode provided on a layer above the channel to overlap with the channel and connected with the bottom gate electrode; and
a second gate insulating layer provided between the channel and the top gate electrode, and
wherein the storage capacitor includes:
a second part of the bottom gate electrode, and
a storage capacitor electrode made of an impurity semiconductor included in a same layer as the channel, and provided to overlap with the second part of the bottom gate electrode with the first gate insulating layer interposed therebetween without overlapping the top gate electrode.

7. The OLED display device according to claim 6, wherein a thickness of the first gate insulating layer is equal to or smaller than a thickness of the second gate insulating layer.

8. The OLED display device according to claim 6,
wherein each of the plurality of pixel circuits further includes a second thin film transistor configured to supply a signal to the gate of the first thin film transistor and the storage capacitor,
wherein the second thin film transistor includes a semiconductor area on the same layer as the channel of the first thin film transistor,
wherein the semiconductor area includes a channel of the second thin film transistor and an impurity-doped area continued to the channel of the second thin film transistor, and
wherein the impurity-doped area, the bottom gate electrode of the first thin film transistor, and the top gate electrode of the first thin film transistor are interconnected through a common contact hole.

9. The OLED display device according to claim 8, further comprising:
a second substrate opposed to the first substrate,
a bond disposed to surround the plurality of pixel circuits, the bond bonding the first substrate and the second substrate;
a driver circuit for the second thin film transistors disposed in an area more inward than the bond;
a first wiring layer for the driver circuit provided on the same layer as the bottom gate electrodes, and a second wiring layer for the driver circuit provided on the same layer as the top gate electrodes,
wherein the first and the second wiring layers are provided under the bond.

10. The OLED display device according to claim 6, further comprising:
a plurality of power lines extending in a first direction and being distant from one another on a layer above the top gate electrodes; and
a plurality of auxiliary power lines extending in a second direction different from the first direction on the same layer as the bottom gate electrodes, the plurality of auxiliary power lines being connected, with the plurality of power lines through contacts.

11. A method of manufacturing an OLED display device, the OLED display device including a plurality of pixels and a plurality of pixel circuits,
each of the plurality of pixels including an organic light-emitting film and a lower electrode and an upper electrode sandwiching the organic light-emitting film,
each of the plurality of pixel circuits being configured to control intensity of light to be emitted from one of the plurality of pixels by controlling electric current to be supplied to the pixel,
each of the plurality of pixel circuits including a first thin film transistor configured to supply electric current to the organic light-emitting film through the lower electrode and a storage capacitor configured to maintain gate potential of the first thin film transistor, and
the method comprising:
a first step of forming bottom gate electrodes of the first thin film transistors on a first substrate;
a second step of forming a first gate insulating layer over the bottom gate electrodes;
a third step of forming a semiconductor layer including channels of the first thin film transistors and storage capacitor electrodes of the storage capacitors above the first gate insulating layer in such a manner that each of the channels overlaps with a part of the bottom gate electrode and each of the storage capacitor electrodes of the storage capacitors overlaps with another part of the bottom gate electrode;
a fourth step of forming a second gate insulating layer above the semiconductor layer;
a fifth step of forming top gate electrodes of the first thin film transistors above the second gate insulating layer in such a manner that each of the top gate electrodes overlaps with a channel without overlapping with a storage capacitor electrode; and
a sixth step of injecting an impurity onto regions of the semiconductor layer including the storage capacitor electrodes using the top gate electrodes as a mask.

12. The method according to claim 11, wherein a thickness of the first gate insulating layer is equal to or smaller than a thickness of the second gate insulating layer.

13. The method according to claim 11,
wherein each of the plurality of pixel circuits further includes a second thin film transistor configured to supply a signal to the gate of the first thin film transistor and the storage capacitor,
wherein the semiconductor layer further includes semiconductor areas including channels of the second thin film transistors,
wherein the fifth step includes forming top gate electrodes of the second thin film transistors to overlap with the channels of the second thin film transistors above the second gate insulating layer, and
wherein the method further comprises:
a step of forming a third insulating layer over the top gate electrodes of the first thin film transistors and the second thin film transistors;
a step of forming contact holes passing through the first gate insulating layer, the second gate insulating layer, and the third insulating layer to expose impurity-doped areas of the second thin film transistors, the bottom gate electrodes of the first thin film transistors, and the top gate electrodes of the first thin film transistors; and
a step of forming interconnection electrodes in the contact holes.

14. The method according to claim 13,
wherein the first step includes forming lower wiring for a driver circuit of the second thin film transistors more outward than the plurality of pixel circuits,
wherein, the fifth step includes forming an upper wiring for the driver circuit of the second thin film transistors more outward than the plurality of pixel circuits, and
wherein the method further comprises:
a step of applying glass frit to the first substrate in such a manner that the glass fit covers the lower wiring and the upper wiring,
a step of placing a second substrate on the glass frit; and
a step of heating and melting the glass frit with a laser beam to bond the first substrate and the second substrate.

15. The method according to claim 11,
wherein the first step includes forming a plurality of auxiliary power lines in such a manner that the plurality of auxiliary power lines extend in a first direction together with forming the bottom gate electrodes, and
wherein the method further comprises:
a step of forming a plurality of power lines to transmit electric current to the plurality of pixels on a layer above the top gate electrodes of the first thin film transistors in such a manner that the plurality of power lines extend in a second direction different from the first direction and are distant from one another; and
a step of interconnecting the plurality of auxiliary power lines and the plurality of power lines.

* * * * *